(12) United States Patent
Woo et al.

(10) Patent No.: US 6,979,625 B1
(45) Date of Patent: Dec. 27, 2005

(54) COPPER INTERCONNECTS WITH METAL CAPPING LAYER AND SELECTIVE COPPER ALLOYS

(75) Inventors: Christy Mei-Chu Woo, Cupertino, CA (US); Connie Pin-Chin Wang, Menlo Park, CA (US); Darrell M. Erb, Los Altos, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 67 days.

(21) Appl. No.: 10/704,595

(22) Filed: Nov. 12, 2003

(51) Int. Cl.[7] .......................................... H01L 21/331
(52) U.S. Cl. ..................... 438/309; 438/694; 438/361; 438/687
(58) Field of Search ................................ 438/309, 525, 438/348, 361, 430, 687, 694, 628; 257/525, 257/501–508, 520–521, 659, 762, 767

(56) References Cited

U.S. PATENT DOCUMENTS 6,433,402 B1 * 8/2002 Woo et al. .................. 257/525

* cited by examiner

Primary Examiner—Michael Lebentritt
Assistant Examiner—Yennhu Huynh (57) ABSTRACT

High reliable copper interconnects are formed with copper or a low resistivity copper alloy filling relatively narrow openings and partially filling relatively wider openings and a copper alloy having improved electromigration resistance selectively deposited in the relatively wider openings. The filled openings are recessed and a metal capping layer deposited followed by CMP. The metal capping layer prevents diffusion along the copper-capping layer interface while the copper alloy filling the relatively wider openings impedes electromigration along the grain boundaries.

17 Claims, 5 Drawing Sheets

COPPER INTERCONNECTS WITH METAL CAPPING LAYER AND SELECTIVE COPPER ALLOYS

FIELD OF THE INVENTION

The present invention relates to a semiconductor device comprising a highly reliable copper interconnect structure with improved electromigration resistance, and to a method of forming the highly reliable copper interconnect structure. The present invention is applicable to high speed integrated circuits, particularly integrated circuits having design features in the deep sub-micron range.

BACKGROUND ART

As integrated circuit geometry continues to plunge into the deep sub-micron regime, it becomes increasingly difficult to satisfy the requirements of high performance microprocessor applications for rapid circuitry speed. The speed of semiconductor circuitry varies inversely with the resistance (R) and capacitance (C) of the interconnection system. The higher the value of the R×C product, the more limiting the circuit operating speed. Miniaturization requires long interconnects having small contacts and small cross-sections. Accordingly, continuing reduction of design rules into the deep sub-micron regime requires decreasing the R and C associated with interconnection paths. Thus, low resistivity interconnection paths are critical to fabricating dense, high performance devices.

One way to increase the control speed of semiconductor circuitry is to reduce the resistance of a conductive pattern. Copper (Cu) is considered a viable alternative to aluminum (Al) for metallization patterns, particularly for interconnect systems having smaller dimensions. Cu has a lower bulk resistivity and potentially higher electromigration tolerance than Al. Both the lower bulk resistivity and higher electromigration tolerance improve circuit performance. A conventional approach to forming a Cu interconnection involves the use of damascene processing in which openings are formed in an interlayer dielectric (ILD) and then filled with Cu. Such damascene techniques typically include single as well as dual damascene techniques, the latter comprising forming a via opening in communication with a trench opening and simultaneously filling by metal deposition to form a via in communication with a metal line.

However, Cu is a mid-gap impurity in silicon and silicon dioxide. Accordingly, Cu diffusion through interlayer dielectrics, such as silicon dioxide, degrades the performance of the integrated circuit. A conventional approach to the diffusion problem comprises depositing a barrier material to encapsulate the Cu line. Typically diffusion barrier materials include tantalum (Ta), tantalum nitride (TaN), titanium nitride (TiN), titanium tungsten (TiW), and silicon nitride for encapsulating Cu. The use of such barrier materials to encapsulate Cu is not limited to the interface between the Cu and the ILD, but includes interfaces with other metals as well. In depositing Cu by electroless deposition or electroplating, a seedlayer is also typically deposited to catalyze electroless deposition or to carry electric current for electroplating. For electroplating, the seedlayer must be continuous. However, for electroless plating, very thin catalytic layers can be employed in the form of islands.

Conventional Cu interconnect methodology typically comprises planarizing after Cu deposition, as by chemical-mechanical polishing (CMP), such that the upper surfaces of the filled trenches are substantially coplanar with the upper surface of the ILD. Subsequently a capping layer, such as silicon nitride, is deposited to complete encapsulation of the Cu inlaid metallization. However, adhesion of such a capping layer as to the Cu inlaid metallization has been problematic, and Cu diffusion along the surface of the interface with the capping layer has been found to be a major cause of electromigration failure.

Conventional semiconductor manufacturing processes typically comprise forming a metal level having metal lines with varying widths. A metal level, therefore, typically comprises a collection of metal lines with line widths ranging from about 1× to about 50× of the smallest feature size. Such a smallest feature size can be a via having a diameter or cross sectional width of about 0.15 $\mu$m to about 10 $\mu$m. In implementing Cu metallization in narrow lines, e.g., lines having a width less than about 0.15 $\mu$m, it was found that voiding typically occurs after thermal annealing.

The primary weak surface responsible for electromigration failures is the interface between the Cu fill and capping layer. Rapid diffusion of Cu along this interface causes electromigration failures in both wide and narrow lines. Electromigration can be enhanced by reducing the speed of Cu diffusion along this interface by altering the nature of Cu, as by alloying, or by changing the capping layer. The introduction of certain alloying elements into Cu can reduce Cu diffusion albeit at an increase in resistance. This type of approach to reducing electromigration failure is best utilized in wide metal lines, because the increase in resistance will have a greater impact in narrow lines.

The use of a metal capping layer as an alternative to the conventional silicon nitride capping layer may improve the Cu-capping layer interface, thereby reducing rapid Cu diffusion at that junction. However, any advantage attendant upon employing a metal capping layer diminishes as the metal lines get wider, because Cu diffusion occurs not only along the Cu-capping layer interface but also along Cu grain boundaries. Grain boundary diffusion is not significant in narrow lines because there are very few grain boundaries in a narrow line. These various factors make it extremely difficult to fabricate highly reliable Cu interconnect systems with improved electromigration resistance.

Accordingly, there exists a need for methodology enabling implementation of Cu metallization with improved electromigration resistance in both relatively wide and relatively narrow lines, and reduced void generation in relatively narrow lines. There exists a particular need for such Cu metallization methodology in fabricating semiconductor devices having metal levels with varying line widths in the deep sub-micron regime.

DISCLOSURE OF THE INVENTION

An advantage of the present invention is a method of manufacturing a semiconductor device containing Cu metallized interconnection patterns, exhibiting improved electromigration resistance in both relatively wide lines and relatively narrow lines, and having reduced voids in relatively narrow lines.

Another advantage of the present invention is a semiconductor device having Cu metallized interconnection patterns exhibiting improved electromigration resistance in both relatively wide lines and relatively narrow lines, and having reduced voids in relatively narrow lines.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: forming a plurality of openings in a dielectric layer having an upper surface, at least one of the openings having a width no greater than a first width and at least one of the openings having a width greater than the first width; depositing a layer of substantially pure copper (Cu) or a first Cu alloy completely filling the at least one opening having a width no greater than the first width and partially filling the at least one opening having a width greater than the first width; depositing a layer of a second Cu alloy, containing an element in a sufficient amount such that the electromigration resistance along grain boundaries of the second Cu alloy is greater than that of substantially pure Cu and greater than that of the first Cu alloy, to completely fill the at least one opening having a width greater than the first width; planarizing the upper surface of the dielectric layer; forming a recess in the filled openings; and depositing a metal capping layer filling the recess.

Embodiments of the present invention include forming the plurality of openings such that the designated first width is about 5 times the smallest feature size, e.g., an interconnection via having a diameter (or width in cross section) of no greater than about 0.20 micron. Embodiments further include depositing a second Cu alloy that contains an element that imparts electromigration resistance to Cu and diffuses to the grain boundary thereby reducing the grain boundary diffusion mechanism of electromigration, such as tin, zirconium, titanium and chromium. The second Cu alloy can have a resistivity lower than, equal to or greater than the first Cu alloy. Embodiments of the present invention further include performing a first thermal anneal after depositing the substantially pure Cu or first Cu alloy layer and before depositing the second Cu alloy layer, planarizing by CMP stopping on the barrier layer, forming the recess in the filled openings, at a depth of about 200 Å to about 500 Å; and then performing a second thermal anneal such that Cu alloying element diffuses into the grain boundaries of the second Cu alloy layer.

Another aspect of the present invention is a semiconductor device comprising: an interlayer dielectric (ILD) having an upper surface; a plurality of trenches in the ILD, the plurality of trenches comprising: a plurality of small openings having a width no greater than a first width; and a plurality of large openings having a width greater than the first width; metal lines filling the trenches; wherein the metal lines filling the small trenches comprise substantially pure copper (Cu) or a first Cu alloy; and the metal lines filling the large trenches comprise a lower layer of substantially pure Cu or the first Cu alloy and an upper layer of a second Cu alloy on the lower layer, the second Cu alloy containing a sufficient amount of an element such that the electromigration resistance of the second Cu alloy is greater than that of substantially pure Cu and greater than that of the first Cu alloy; and a metal capping layer formed in a recess in the metal lines such that an upper surface of the metal capping layer is substantially coplanar with the upper surface of the ILD.

Additional advantages of the present invention will become readily apparent to those skilled in the art from the following detailed description, wherein embodiments of the present invention are described, simply by way of illustration of the best mode contemplated for carrying out the present invention. As will be realized, the present invention is capable of other and different embodiments and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

FIGS. 1A through 8 schematically illustrate sequential phases of a method in accordance with an embodiment of the present invention, with FIGS. 1A and 1B illustrating alternative initial phases. In FIGS. 1A through 8, similar elements are denoted by similar reference numerals.

DESCRIPTION OF THE INVENTION

The present invention addresses and solves problems attendant upon forming Cu interconnections, particularly when implementing damascene techniques wherein Cu is deposited to fill openings in a dielectric layer that have different widths to form a metal level comprising Cu lines having different widths. Typical metal levels comprise a collection of metal lines with line widths ranging from about 1× to 50× of the smallest feature size, such as a via with a cross sectional width, e.g., a width of about 0.15 micron. Thus, in implementing damascene techniques, a plurality of openings, e.g., trenches, are formed with various size openings. Upon investigating failed or rejected semiconductor devices, it was found that the interface between the Cu metallization and capping layer, e.g., silicon nitride, is a source for electromigration failure due to Cu diffusion along the interface. In addressing this problem, substantially pure Cu was replaced with a Cu alloy containing an element, such as tantalum, indium, tin, zinc, magnesium or zirconium, that improves the electromigration resistance of substantially pure Cu.

It was found, however, that such Cu alloys formulated for improved electromigration resistance exhibit higher resistivity than substantially pure Cu as well as some Cu alloys, such as those which inevitable form by virtue of the presence of elements in the plating bath. It was further found that such Cu alloys with improved electromigration resistance cause an undesirably high increase in resistance in relatively narrower lines vis-à-vis relatively wider lines.

Another problem addressed and solved by the present invention is the generation of voids within relatively narrow metal lines upon thermal cycling. After experimentation and investigation, it was found that for a completely filled metal line, void formation within the narrow lines can be reduced by reducing the amount of overburden or bulk Cu or Cu alloy above the filled trench during thermal annealing. Conventional practices involve forming a Cu or Cu alloy metal level of different line widths by depositing a sufficient amount of bulk Cu or Cu alloy to ensure complete filling of the relatively wide trenches. Consequently, the narrower lines have a relatively thicker bulk Cu layer above the plane of complete fill during thermal anneal and, hence, a significantly greater amount of voids are generated in relatively narrow lines after thermal annealing than in relatively wider lines.

The use of a metal capping layer can improve the interface between the filled Cu and capping layer, thereby reducing the diffusivity of Cu along the interface. However, Cu diffusion along the grain boundaries becomes problematic with respect to electromigration failure; whereas, in relatively narrow lines, there are very few grain boundaries. The present invention also addresses the problem of electromigration failure due to Cu diffusion along grain boundaries in relatively wide lines.

The present invention addresses and solves the mentioned electromigration problems while simultaneously avoiding an increase in resistivity of the narrow metal lines. Embodiments of the present invention further include reducing void formation in relatively narrower lines when metallizing a level having trenches of varying widths to form metal lines of varying width.

The present invention achieves these and other objectives by initially forming a plurality of openings in a dielectric layer, e.g., trenches in an ILD, the trenches having a plurality of widths to ultimately form metal lines having widths ranging from about 1× to about 50× of the smallest feature size, such as a via, e.g., a via having a cross sectional width of about 0.15 micron or under. Having recognized that the dominant electromigration failure mechanism in narrow lines is not along the interface between the inlaid Cu and capping layer, the present invention strategically avoids depositing a Cu alloy exhibiting higher resistivity than substantially pure Cu or other Cu alloys and formulated for reduced electromigration in the narrower trenches. Having recognized the grain boundary electromigration problem in wide lines, the second Cu alloy is formulated to achieve grain boundary segregation of alloying elements for improved electromigration resistance and is strategically deposited to fill only the relatively wide trenches.

Embodiments of the present invention, therefore, comprise depositing a first layer comprising substantially pure Cu or a first Cu alloy having a minor amount of an alloying element or elements, such as Cu alloys containing minor amounts of elements that do not significantly increase the resistivity of the Cu alloy above about 2.0 μohm-cm, or a resistivity no more than about 20% greater than that of pure Cu, e.g., silver (Ag). The initially deposited layer can also comprise Cu containing unavoidable impurities as well as alloying elements and/or ingredients present by virtue of the particular plating bath employed. It should be understood that the initially deposited layer is not a Cu alloy formulated for improved electromigration resistance which would otherwise increase the resistivity of the narrower lines to an unacceptable or undesirable extent.

Manifestly, the amount of metal present in the interconnection line is directly proportional to the width of the line. Wider lines require more of the second Cu alloy formulated to improve electromigration resistance by preventing diffusion along the larger interface surface. The present invention advantageously enables control of the amount of the second Cu alloy in different line widths to improve the weak inlaid metal-capping layer interface thereby improving electromigration resistance but without sacrificing resistivity or contact resistance in the narrower lines.

Accordingly, after depositing a barrier layer, such as Ta and/or TaN, the initial layer of substantially pure Cu or the first Cu alloy is deposited to a sufficient extent to fill the narrower metal lines not subject to electromigration failure along the inlaid metal-capping layer interface since the interface is not significantly large and there are very few grain boundaries. For example, it was found adequate to deposit the initial layer of substantially pure Cu or the first Cu alloy to completely fill the narrower trenches having a width of about 1 to about 5 times the smallest feature size, such as the smallest via, e.g., a via with a cross sectional width of about 0.15 micron or less. In so doing, a relatively thin metal overburden is formed over such narrower trenches, e.g., extending up to about 1,000 Å above the upper surface of the ILD. In accordance with embodiments of the present invention, a first annealing step is strategically conducted to allow Cu grain growth to relieve the stress accumulated during the initial damascene fill process. The anneal cycle temperature can range from about 100° C. to about 350° C. for about 2 minutes to about 1 hour. Annealing can be conducted in nitrogen, or in a forming gas containing about 1 to about 4 vol. % hydrogen, the balance nitrogen, or in a mixture of nitrogen, hydrogen and helium. The strategic implementation of an anneal at this point while there is a relatively small metal overburden overlying the filled narrower trenches substantially eliminates or significantly reduces the formation of voids in narrower lines.

Subsequently, the second Cu alloy formulated for improved electromigration resistance, e.g., an alloy containing a sufficient amount, such as about 0.01 at. % to about 5.0 at. %, e.g., about 0.01 at. % to about 1.0 at. %, of an element having a relatively low solid solubility in Cu, e.g., less than about 0.1 at. % in Cu at room temperature, such as tin, chromium, titanium, zirconium and/or silver, is deposited to completely fill the larger openings and form an overburden on the substantially pure Cu or first Cu alloy overburden, having a thickness of about 1,000 Å to about 3,000 Å, thereby extending over the upper surface of the ILD to greater than about 2,000 Å. The second Cu alloy can have a resistivity not greater than about 2.0 μohm-cm or a resistivity no more than about 20% greater than that of pure Cu. Thus, the second Cu alloy is selectively deposited in the relatively wider trenches only, and the amount of the second Cu alloy progressively increases with increasing trench width, since wider trenches have more unfilled area after the initial metal deposition. As the narrower trenches are already filled and do not require a Cu alloy formulated for improved electromigration resistance along the interface between the inlaid metal and capping layer due to a small surface area, or along the grain boundaries because there are very few grain boundaries, the absence of the second Cu alloy in the narrower trench openings preserves the low metal line resistance of the narrower lines.

Subsequently, CMP is conducted to remove the overburden stopping on the barrier layer. A small recess is then formed within the filled openings, as at a depth from the upper surface of the ILD of about 200 Å to 500 Å. The recess can be formed by prolonging the CMP process or by wet etching. Suitable etchants include an aqueous solution of hydrogen peroxide ($H_2O_2$), as at concentrations of 3 wt. % to 30 wt. %, e.g., 9.4 wt. %, having a pH of 2.5 to 6.5, e.g., 4.85, containing malic acid (0.10 wt. %), an ethylene oxide-propylene oxide copolymer (5.0 wt. %), ammonium saltate (4.6 wt. %) and ammonium hydroxide (0.10 wt. %).

A second thermal annealing treatment is then conducted to allow Cu grain growth within the second Cu alloy and redistributing the alloying element within the grain boundaries of the second Cu alloy. The second thermal anneal can also be conducted at a temperature of about 100° C. to about 350° C., employing a similar ambient as during the first thermal anneal.

A metal capping layer is then deposited, such as Ta, cobalt-tungsten-phosphorus (CoWP), tungsten (W) or Ruthenium (Ru). A metal capping layer provides a slow diffusion path for Cu along the Cu-capping layer interface.

The metal capping layer can be deposited non-selectively over the ILD and filling the recesses formed within the filled openings. Such non-selective deposition can be implemented by a physical vapor deposition (PVD) technique, as by depositing a layer of Ta. The metal capping layer can also be selectively deposited on Cu, as by depositing a layer of CoWP or W. In embodiments wherein the metal capping layer is deposited non-selectively, as by depositing a metal capping layer of Ta, CMP is implemented to remove both the deposited metal capping layer and underlying barrier layer, which is typically Ta, such that the upper surface of the ILD is substantially coplanar with the upper surface of the metal capping layer within the recesses of the filled openings. In embodiments wherein the metal capping layer is selectively deposited within the recesses in the filled metal lines but not on the barrier layer overyling the ILD, CMP is implemented to remove the remaining barrier layer from the upper surface of the ILD such that the upper surface of the ILD is substantially coplanar with the upper surface of the metal capping layer filing the recesses in the filled openings.

In accordance with embodiments of the present invention, the first thermal anneal can be implemented by performing an elevated temperature degassing step prior to depositing the second Cu alloy. In alternative embodiments of the present invention, the second thermal anneal can be implemented by performing an elevated temperature degassing step prior to depositing the metal capping layer.

In implementing embodiments of the present invention, metallization can be implemented by various techniques, such as electrodeposition or electroless plating. Typically, a conventional barrier layer and/or a seedlayer is initially deposited before filling the trenches. The initial deposition of substantially pure Cu or the first Cu alloy can be implemented by a conventional conformal- or a conventional preferential filling-type technique. Conformal filling can be implemented by electroplating, electroless plating and chemical vapor deposition techniques. Preferential filling can be implemented employing a conventional electroplating technique with bottom-enhanced filling chemistry and plating process controlled. For either conformal or preferential fill, bulk metal is deposited on the bottom as well as the sidewall of an opening and, therefore, relatively narrower lines are completely filled at a faster rate than relatively wider lines as metal from the sidewall of the narrower openings meet and coalesce more rapidly.

Bottom enhanced filling can be implemented employing a conventional additive designed to enhance bottom filling, such as Nanoplate 2001 or Ultrafill 2001, both manufactured by Shipley Co., of Marlboro, Mass., which additive can be mixed with the plating solution employed in the initial deposition process.

In implementing embodiments of the present invention, the dielectric layer can comprise any conventional dielectric material employed in the manufacture of semiconductor devices, including any of various of silicon oxides and low dielectric constant materials, including polymers. Suitable low dielectric constant materials include FLARE 2.0™ dielectric, a poly(arylene)ether available from Allied Signal Advanced Micro Electronic Materials, Sunnyvale, Calif., BCB (divinylsiloxane bis-benzocyclobutene) and SILK™, an organic polymer similar to BCB, both available from Dow Chemical Co., Middleton, Mich., silicon-carbon-oxygen-hydrogen (SiCOH) organic dielectrics, and BLACK DIAMOND™ dielectric available from Applied Material in Santa Clara, Calif.

An embodiment of the present invention is schematically illustrated in FIGS. 1A through 8 wherein similar features are denoted by similar reference numerals. Adverting to FIGS. 1A and 1B, a plurality of trenches $T_1$–$T_5$ having varying widths are formed in an ILD 10, e.g., a silicon oxide. A barrier layer 11 is then deposited, such as tantalum or tantalum nitride, lining each trench opening. A seedlayer (not shown) may also be employed. Typical seedlayers include Cu alloys containing magnesium, aluminum, zinc, zirconium, tin, nickel, palladium, silver or gold in a suitable amount, e.g, about 0.3 to about 12 at. %.

Figure 1A:
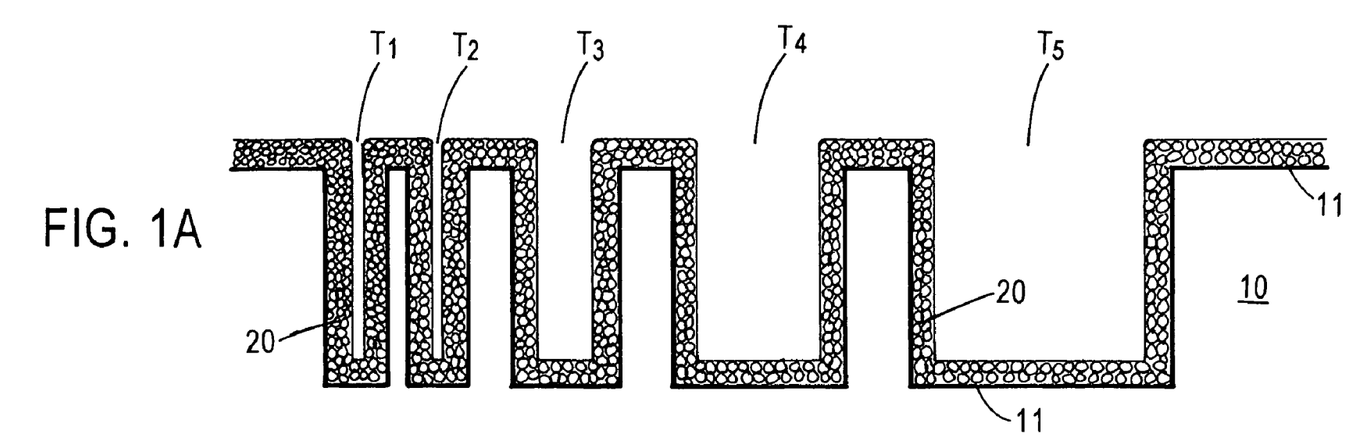
Figure 1B:
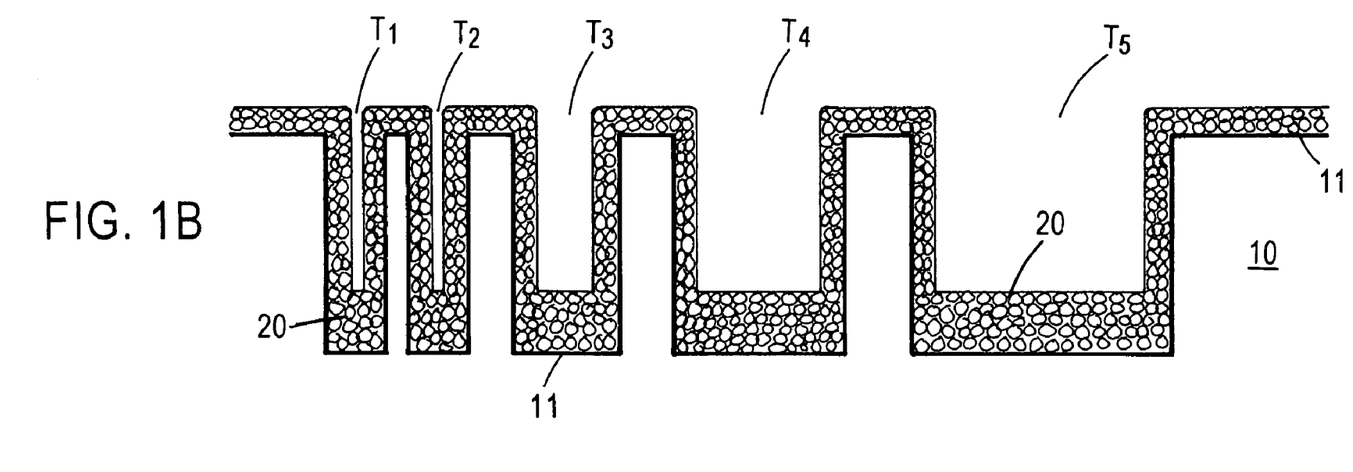

Substantially pure Cu or a first Cu alloy 20 having a resistivity of no greater than about 2.0 µohm-cm is then deposited employing a conformal or preferential filling technique. In FIG. 1A, the initial Cu filling is illustrated with a conformal filling technique such as electroplating, electroless plating, physical vapor deposition or chemical vapor deposition. A preferential filling technique is illustrated in FIG. 1B and can be implemented using electroplating with bottom-enhanced filling chemistry and appropriate adjustment of the plating conditions. For either conformal or preferential filling, the initial layer of substantially pure Cu or first Cu alloy is deposited on the bottom of the trench as well as on the sidewalls thereby enabling the narrow lines to completely fill at a rate faster than the wider lines, since coalescence of the initial fill from the sidewalls occurs sooner.

Figure 2:
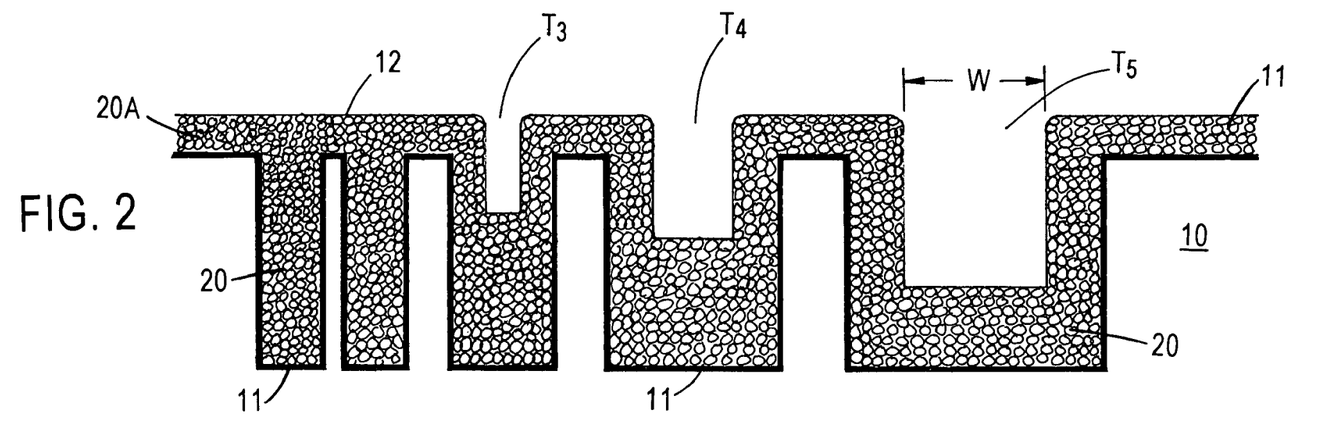

As shown in FIG. 2, continued initial deposition results in complete filling of the relatively narrower trenches $T_1$ and $T_2$ and incomplete filling of the relatively wider trenches $T_3$–$T_5$. The initial deposition is ceased upon filling of the narrower trenches, e.g., $T_1$ and $T_2$ with substantially pure Cu or the first Cu alloy 20 leaving a relatively small overburden 20A, e.g., up to about 1,000 Å.

Figure 3:
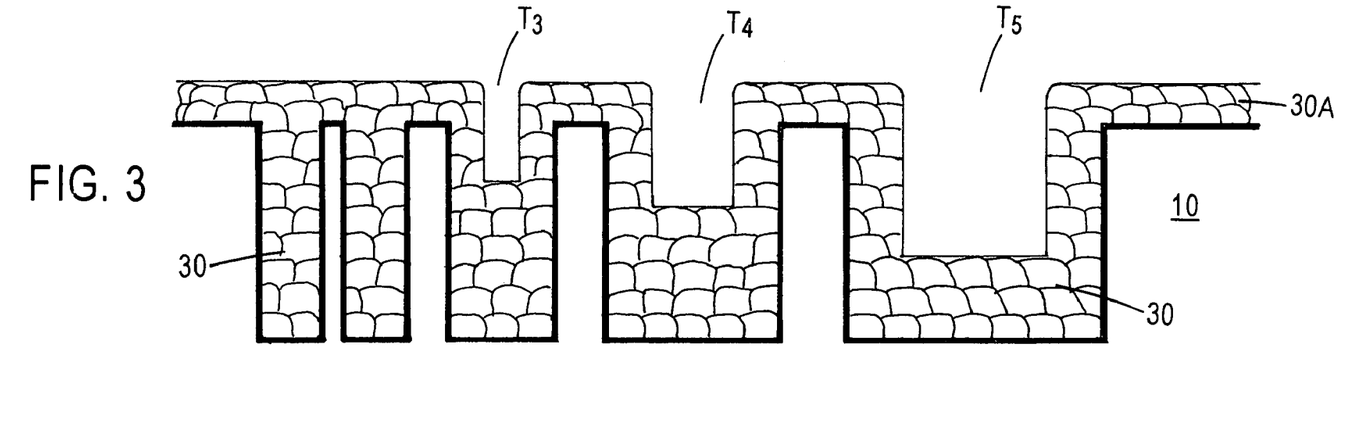
Figure 4:
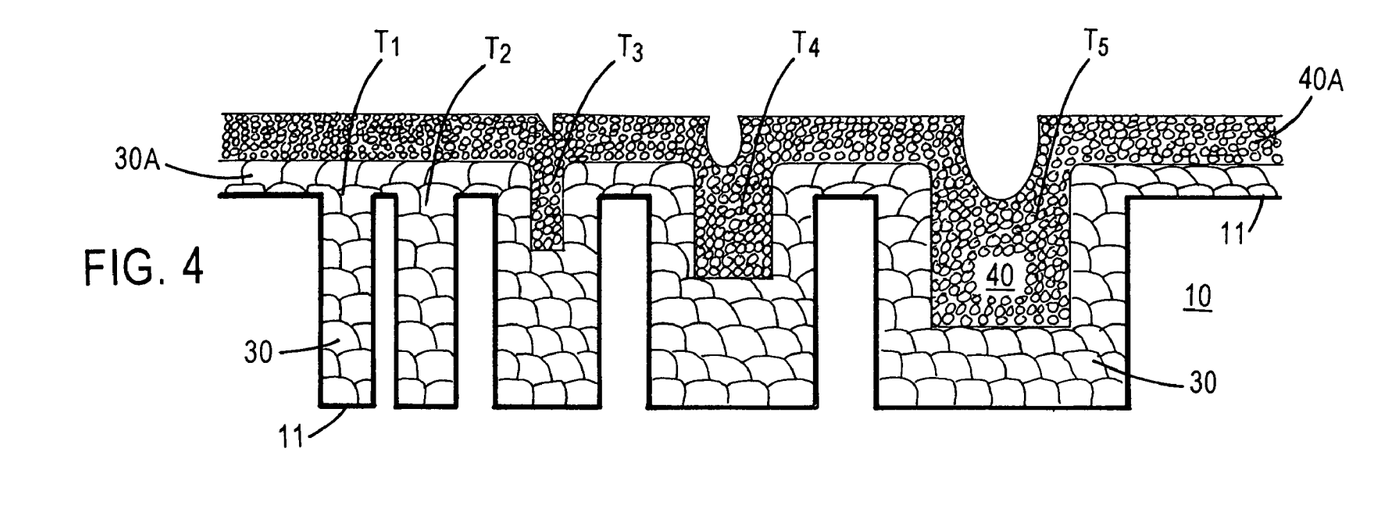

A first thermal annealing is then conducted, as at a temperature of about 100° C. to about 350° C., to effect grain growth and relief of the stress accumulated during damascene filling. The resulting structure having substantially pure Cu or the first Cu alloy with larger grains 30 and heat treated overburden 30A is illustrated in FIG. 3. Subsequently, as shown in FIG. 4, the second Cu alloy 40 is selectively deposited into the relatively wider trenches $T_3$–$T_5$ completely filling them without entering the relatively narrower trenches $T_1$ and $T_2$ and forming an overburden 40A of about 1,000 Å to about 3,000 Å on the substantially pure Cu or Cu alloy overburden 30A. The amount of the second Cu alloy 40 progressively increases with line width since the wider lines, e.g., trench $T_5$ having a width W, have larger unfilled openings after the initial metal deposition. By selectively depositing the second Cu alloy formulated for electromigration resistance only in the relatively wider trenches wherein electromigration resistance failure occurs, while avoiding depositing the second Cu alloy in the narrower trenches, electromigration resistance is improved without sacrificing narrow line resistance. In addition, voiding in narrower lines is substantially prevented or significantly reduced by conducting a first thermal anneal with a minimal overburden on the narrow lines.

Figure 5:
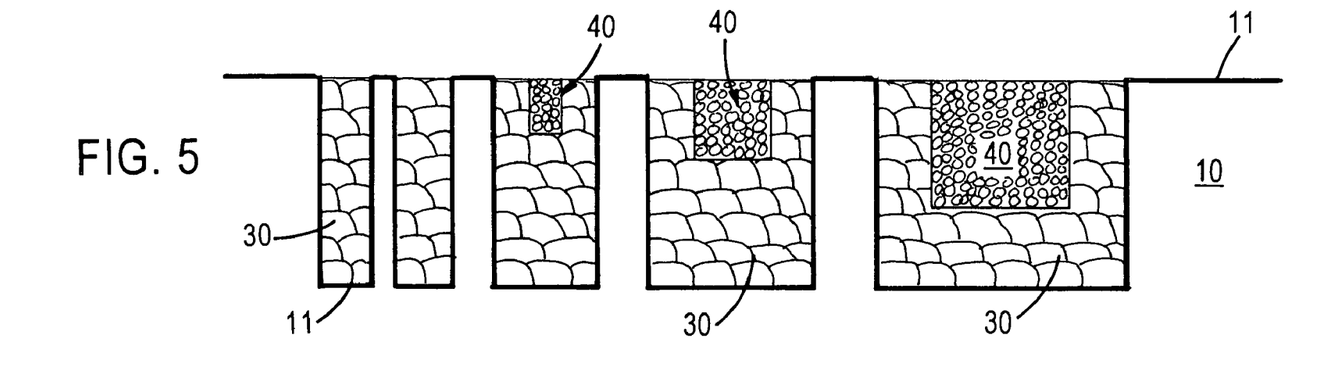

Subsequently, CMP is conducted, as shown in FIG. 5, stopping on barrier layer 11 to form a planarized upper surface. The relatively larger trenches ($T_3$–$T_5$), contain both the substantially pure Cu or the first Cu alloy 30 as well as the second Cu alloy 40.

Recesses 60 are then formed in the filled metal lines, typically at a depth R from the upper surface of ILD 10 of about 200 Å to about 500 Å. Recesses 60 can be formed by overpolishing during CMP or by etching.

Figure 6:
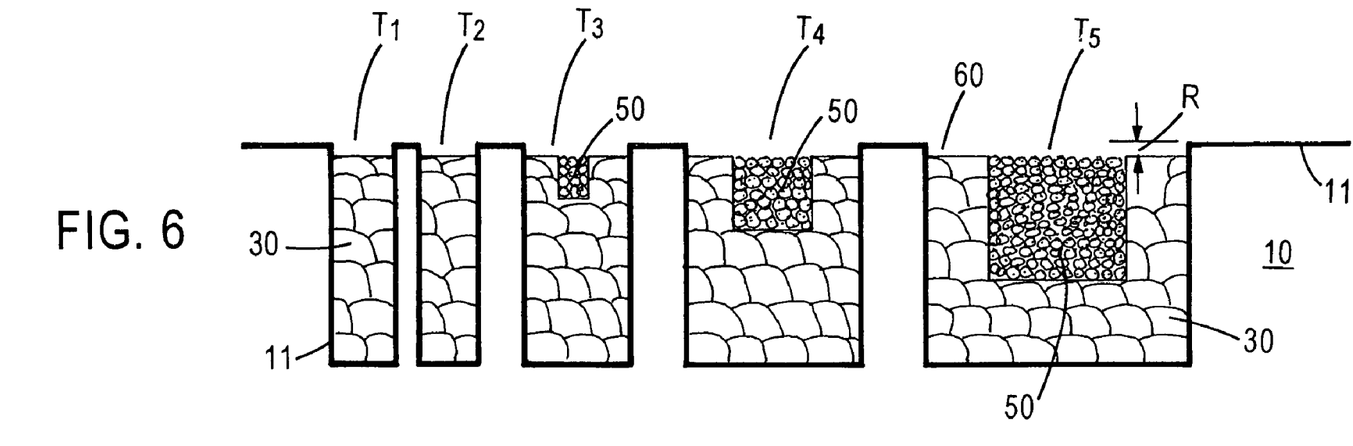
Figure 7:
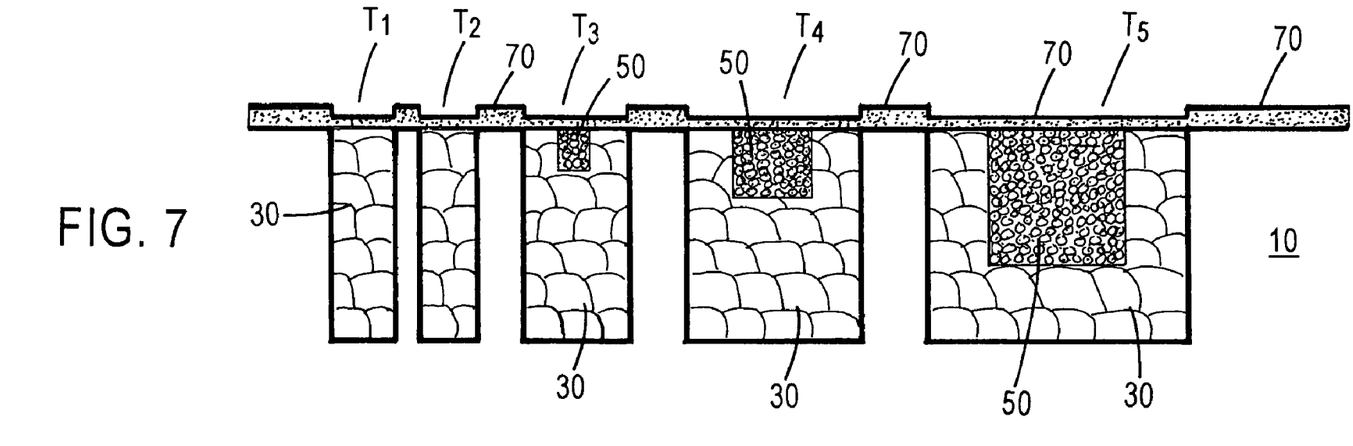
Figure 8:
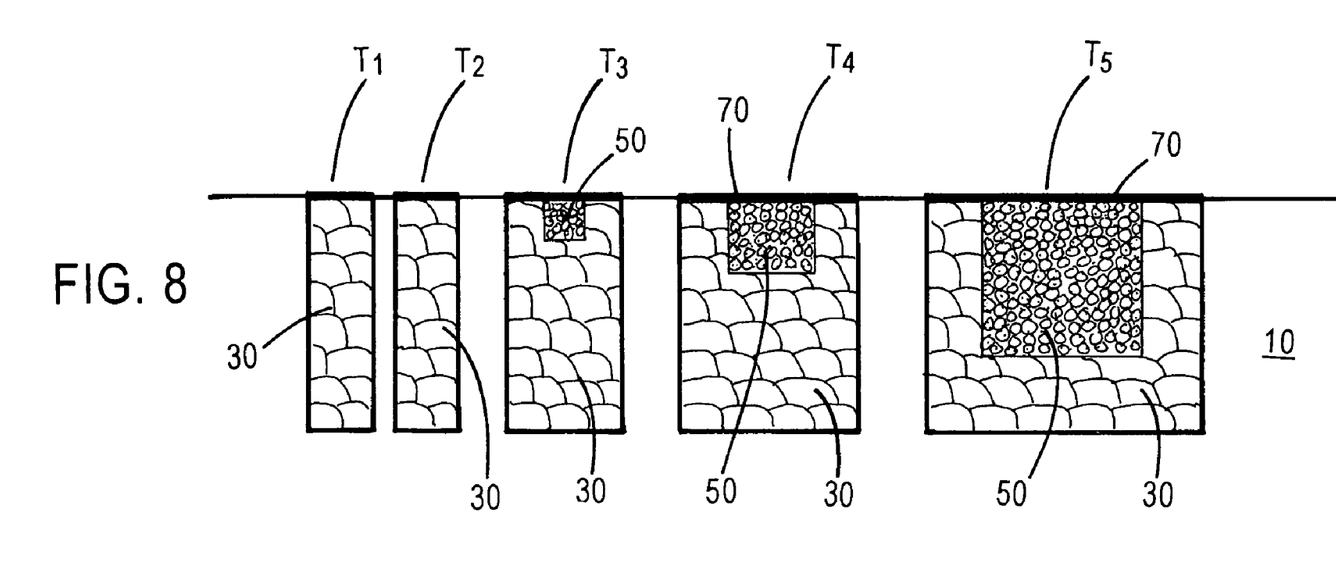

A second thermal annealing is then conducted, as a temperature of about 100° C. to about 350° C., to allow Cu grain growth within the second Cu alloy and diffusion of the alloying element to grain boundaries within the heat treated second Cu alloy 50. The resulting intermediate structure is shown in FIG. 6. Subsequently, as shown in FIG. 7, a metal capping layer 70 is deposited. As illustrated, metal capping layer 70 was deposited non-selectively filling the recesses and on the barrier layer 11 over the ILD 10. CMP is then implemented, as shown in FIG. 8, thereby forming a planarized surface wherein the upper surface of the metal capping layer 70 within the recesses is substantially coplanar with the upper surface of ILD 10. In other embodiments, the metal capping layer 7 can be selectively deposited within recesses 60 followed by CMP to remove barrier layer 11 from the upper surface of the ILD 10 resulting in the structure illustrated in FIG. 8.

Embodiments of the present invention enable fabrication of semiconductor devices with Cu metallization levels having varying line widths with an attendant reduction in electromigration failures at the interface between the inlaid metallization and capping layer, an attendant reduction in electromigration failures due to grain boundary diffusion while preventing an undesirable increase in the resistance of the narrower lines. In addition, the strategic implementation of an annealing step after the narrower trenches are filled substantially prevents or significantly reduces voiding in the narrower metal lines.

The present invention enjoys industrial applicability in manufacturing highly integrated semiconductor devices containing Cu metallization interconnection patterns. The present invention enjoys particular applicability in manufacturing semiconductor devices exhibiting increased circuit speed and sub-micron dimensions, e.g., semiconductor devices having a design rule of about 0.12 micron and under.

In the preceding description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not as restrictive. It is understood that the present invention is capable of using various other combinations and embodiments and is capable of any changes or modifications within the scope of the inventive concept as expressed herein.

What is claimed is:

1. A method of manufacturing a semiconductor device, the method comprising:
   forming a plurality of openings in a dielectric layer having an upper surface, at least one of the openings having a width no greater than a first width and at least one of the openings having a width greater than the first width;
   depositing a layer of substantially pure copper (Cu) or a first Cu alloy completely filling the at least one opening having a width no greater than the first width and partially filling the at least one opening having a width greater than the first width;
   depositing a layer of a second Cu alloy, containing an element in a sufficient amount such that the electromigration resistance along grain boundaries of the second Cu alloy is greater than that of the first Cu alloy or is greater than that of substantially pure Cu, to completely fill the at least one opening having a width greater than the first width;
   planarizing the upper surface of the dielectric layer;
   forming a recess in the filled openings; and
   depositing a metal capping layer filling the recess.

2. The method according to claim 1, comprising depositing a barrier layer to line the openings before depositing the substantially pure Cu or first Cu alloy layer.

3. The method according to claim 2, comprising:
   forming the plurality of openings comprising:
      a plurality of small openings having a width up to the first width; and
      a plurality of large openings having a width greater than the first width;
   depositing the Cu or first Cu alloy layer completely filling the small openings and at most partially filling the large openings; and
   depositing the second Cu alloy layer to completely fill the large openings.

4. The method according to claim 3, comprising
   performing a first thermal anneal after depositing the Cu or first Cu alloy layer completely filling the small openings;
   planarizing by chemical-mechanical polishing stopping on the barrier layer; and
   performing a second thermal anneal after planarizing.

5. The method according to claim 4, comprising
   performing the first and second thermal anneals at a temperature of about 100° C. to about 350° C.

6. The method according to claim 4, wherein the second Cu alloy contains an element selected from the group consisting of tin, zirconium, titanium and chromium.

7. The method according to claim 4, comprising conducting the second thermal anneal after forming the recess in the filled openings.

8. The method according to claim 7, comprising forming the recess at a depth of about 200 Å to about 500 Å from the upper surface of the dielectric layer.

9. The method according to claim 3, comprising depositing substantially pure Cu to substantially fill the small openings and at most partially fill the large openings.

10. The method according to claim 3, comprising depositing the first Cu alloy to substantially fill the small openings and at most partially fill the large openings, wherein the second Cu alloy has a resistivity lower than, equal to or greater than that of the first Cu alloy.

11. The method according to claim 3, comprising depositing a layer of Ta, CoWP, W or Ru, as the metal capping layer.

12. The method according to claim 11, comprising:
   selectively depositing the metal capping layer on the Cu or Cu alloys filling the recesses; and
   conducting chemical-mechanical polishing to remove the barrier layer from the upper surface of the dielectric layer.

13. The method according to claim 11, comprising:
   depositing the metal capping layer over the dielectric layer; and
   planarizing by chemical-mechanical polishing to remove the metal capping layer and barrier layer from the upper surface of the dielectric layer.

14. The method according to claim 3, wherein the first width is about five times the smallest feature size.

15. The method according to claim 14, wherein the smallest feature size is a via having a cross sectional width no greater than about 0.2 micron.

16. The method according to claim 1, comprising conducting the recited steps sequentially.

17. The method according to claim 1, comprising forming the recess by prolonging planarization or by wet etching.

* * * * *